United States Patent [19]

Glenat et al.

[11] Patent Number: 5,172,085
[45] Date of Patent: Dec. 15, 1992

[54] COAXIAL RESONATOR WITH DISTRIBUTED TUNING CAPACITY

[75] Inventors: Henri Glenat, Corenc; Nelly Kernevez, Grenoble, both of France

[73] Assignee: Commissariat a l'Energie Atomique, Paris, France

[21] Appl. No.: 655,828

[22] Filed: Feb. 14, 1991

[30] Foreign Application Priority Data

Feb. 26, 1990 [FR] France ................. 90 02347

[51] Int. Cl.[5] ................. H01P 7/04; G01R 33/20
[52] U.S. Cl. ................. 333/222; 333/223; 324/318
[58] Field of Search ................. 333/219, 222, 223; 324/318, 322

[56] References Cited

U.S. PATENT DOCUMENTS

| | | | |
|---|---|---|---|
| 4,717,880 | 1/1988 | Ono et al. | 324/316 |
| 4,751,464 | 6/1988 | Bridges | 333/219 X |
| 4,820,985 | 4/1989 | Eash | 324/322 X |
| 4,992,737 | 2/1991 | Schnur | 324/318 |

FOREIGN PATENT DOCUMENTS

| | | |
|---|---|---|
| 2092998 | 1/1972 | France . |
| 2098624 | 3/1972 | France . |
| 0627340 | 8/1949 | United Kingdom . |

OTHER PUBLICATIONS

Journal Of Physics E. Scientific Instruments, vol. 2, No. 12, Dec. 1969, Ishing, Bristol, GB, pp. 1036-1040; M. Decorps et al., "Etude comparative de divers ...".
Electronic Components And Applications, vol. 6, No. 2, 1984, Eindhoven NL, pp. 83-86; H. Fiedeldy: "VHF power amplifiers with broadband input circuitry".

Primary Examiner—Eugene R. LaRoche
Assistant Examiner—Seung Ham
Attorney, Agent, or Firm—Oblon, Spivak, McClelland, Maier & Neustadt

[57] ABSTRACT

A coaxial resonator with a distributed tuning capacity. The resonator includes one outer conductor and one central conductor, both conductors having a symmetry of revolution around a predetermined central axis. The tuning capacitor is fully distributed along the axis of the resonator and includes at least two cylindrical armatures nested into each other and having the axis of the resonator as their central axis, one of the two armatures constituting one of the two conductors of the resonator. The coaxial resonator may find particular application for RMN magnetometer probes.

11 Claims, 9 Drawing Sheets

COAXIAL RESONATOR WITH DISTRIBUTED TUNING CAPACITY

FIELD OF THE INVENTION

The present invention concerns a coaxial resonator with distributed tuning capacity. Such a resonator can be used in nuclear magnetic resonance magnetometer probes (RMN probes). One of the spheres of application of the invention is therefore the measurement of magnetic fields, especially a terrestial magnetic field. But the resonator of the invention may also be used in other devices.

BACKGROUND OF THE INVENTION

When used in a RMN probe, the resonator of the invention is described in detail in the French patents FR-A-1 447 226 and FR-A-2 098 624 and accordingly this device shall not be described here in further detail. It merely suffices to mention that the probe includes one or several flasks containing a liquid sample (also called a "radical solution"), these flasks being disposed in a coaxial resonator. This resonator is constituted by a central conductor traversing the flask(s) and an external conductor situated around the flask(s). The probe includes windings for taking up and reinjecting a signal on the LARMOR frequency. This frequency is defined by the magnetic field in which the probe is immersed and by the actual gyromagnetic ratio to the liquid sample used.

Figure 1:
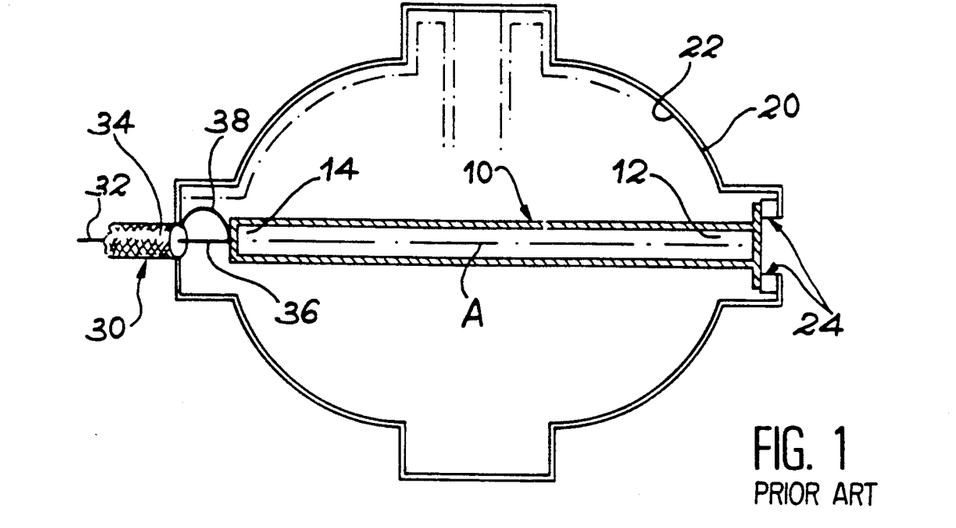
FIG. 1, already described, shows a resonator for a RMN probe according to the prior art.

An RMN resonator according to the prior art is shown on the annexed FIG. 1 and includes:

- a central conductor 10 having the shape of a circular cylinder with an axis A with one first extremity 12 and one second extremity 14;
- an external conductor 20 rotating around the axis A and constituted by a conductive film deposited on the outer wall of the flasks 22 containing the radical solution, the conductive film generally being divided into sectors;
- tuning capacitors 24 connected between the first extremity 12 of the central conductor 10 and the external conductor 20.

This resonator is fed by a coaxial cable 30 having a central core 32 and an external conductive sheath 34, such as a braid; the sheath is connected to the external conductor 20 and the core 32 to the second extremity; in addition, this extremity 14 is connected in turn to the braid by a loop 38, generally constituted by a silver wire.

This resonator functions as follows. The radiofrequency energy is brought by the coaxial cable 30. The resonance frequency is adjusted by the capacitors 24. The central conductor 10 constitutes a "hot" point (from the point of view of the potential) and the external conductor 20 constitutes a "cold" point. The impedance adaptation between the coaxial cable (whose impedance is generally 50 Ohms) and the resonator is obtained by the loop 38, which behaves like an adjustable inductive resistor short-circuit disposed at the extremity of the coaxial cable.

Figure 2A:
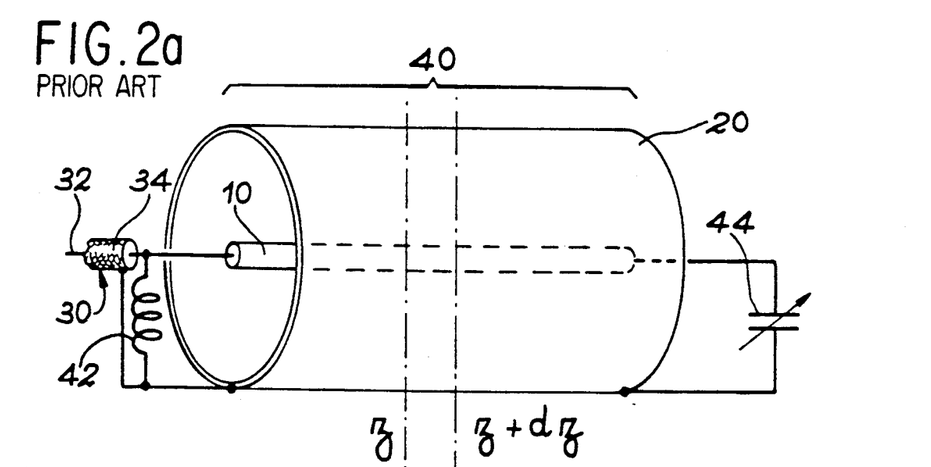
FIGS. 2a, and 2b already described, show the equivalent circuit diagram of a resonator according to the prior art.
Figure 2B:
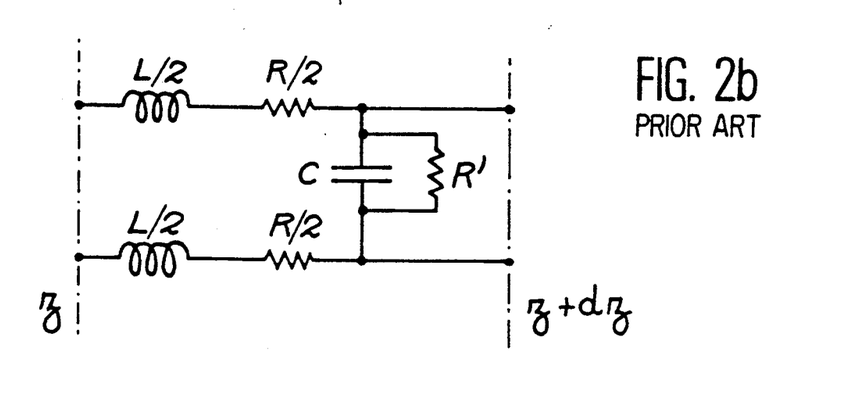

The equivalent circuit diagram of the unit is shown on the accompanying FIG. 2. On the section (a), this diagram shows a resonator 40 with an adaptation loop 42 and a tuning capacitor 44. The resonator 40 is disposed with impedances distributed along the axis z. This means that between the dimension z and the dimension $z+dz$, an elementary section of the resonator is equivalent to the circuit of the section (b) with two inductive resistors $L/2$, two resistors $R/2$, one capacitor C with one parallel resistor $R'$, the values L, C and R, $R'$ being functions of the geometry of the resonator (therefore of z) and the dielectric elements it contains.

Although satisfactory in certain respects, such resonators exhibit a certain number of drawbacks mainly linked to the presence of an adjustment capacitor or capacitors (24 on FIG. 1 and 44 on the diagram of FIG. 2a). These drawbacks are the following:

- it is difficult to find capacitors offering all the conditions required in this application, namely good quality at high frequencies, absence of any rectifier effect, good voltage behaviour, nonmagnetism, ease of adjustment, etc.;
- strong radiation is observed at high frequencies at the level of the capacitors, unless these are shielded;
- the expansion bubble, which inevitably occurs in flasks, may be placed at the level of the adjustment capacitors and detune the resonator;
- the differences (about ±10%) between the capacities of the various tuning capacitors result in differences of intensity in the currents circulating in the sectors of the external conductor to which they are connected and, accordingly, results in losses by radiation.

SUMMARY OF THE INVENTION

The object of the present invention is to overcome all these drawbacks. To this end, it proposes a resonator in which the adjustment capacitor is distributed along the entire resonator, that is in practice, either along the central conductor, this seeming to be more advantageous, or along the external conductor.

This distributed capacity is preferably obtained by two (or possibly three) cylindrical armatures with the same axis as the axis of the resonator and nested into each other, one of the armatures constituing one of the conductors of the resonator.

These armatures may be obtained by depositing a conductive film on a nonconducting tube.

All the drawbacks listed earlier are then eliminated:

- an embodiment of extremely reliable resonators (high frequency quality, absence of any rectifier effect, good voltage behaviour, non-magnetism) is simple;
- as regards adjustment, this is simply obtained by sliding one armature with respect to the other;
- radiation at the end of the resonator is suppressed;
- detuning due to displacement of the expansion bubble is avoided since the bubbles affects the value of the capacitor independent of its position;
- the equality (to within 0.5%) between the various partial capacities of the distributed capacity ensures symmetry of the currents circulating in the sectors of the external conductor and accordingly an absence of any radiation.

In addition to these qualities, it needs to be stressed that the type of capacitor used makes it possible to have the resonator function at frequencies much higher than was the case in the prior art, for example above 300 MHz. Furthermore, there is a large variety of armature (strips, spirals, etc) embodiments able to be effectively used in certain cases.

More specifically, the object of the present invention is to provide a coaxial resonator including one external conductor and one central conductor, both conductors having a symmetry of revolution around a given axis, and at least one tuning capacitor, this resonator being characterized in that the tuning capacitor is distributed entirely along the axis of the resonator and includes at least two cylindrical armatures nested inside each other and having as an axis the axis of the resonator, one of the two armatures constituting one of the two conductors of the resonator.

The capacitor is preferably distributed along the central conductor of the resonator, one of the armatures of the capacitor constituing this central conductor.

According to one advantageous embodiment, the capacitor includes a first armature constituted by a first non-conducting tube externally coated by a first conductive film, and a second armature including a second non-conducting tube nested in the first tube and externally coated with a second conductive film, one of the tubes being able to be moved manually with respect to the other tube.

According to another embodiment, the capacitor further includes a third armature constituted by a non-conducting core coated with a third conductive film, this core being nested in the second tube.

Again, according to another embodiment, the capacitor is distributed entirely along the external conductor of the resonator, one of the armatures of the capacitor constituting this external conductor.

BRIEF DESCRIPTION OF THE DRAWINGS

The characteristics and advantages of the invention shall be more readily understood from a reading of the following description of embodiment examples, given by way of explanation and being in no way restrictive, with reference to the accompanying drawings in which:

FIG. 7 diagrammatically shows a section of a resonator conforming to the invention, this resonator being equipped with a capacitor distributed along the central conductor;

FIGS. 8a and 8b show an equivalent circuit diagram of a resonator according to the invention;

DETAILED DESCRIPTION OF THE PREFERRED EMBODIMENTS

Figure 3:
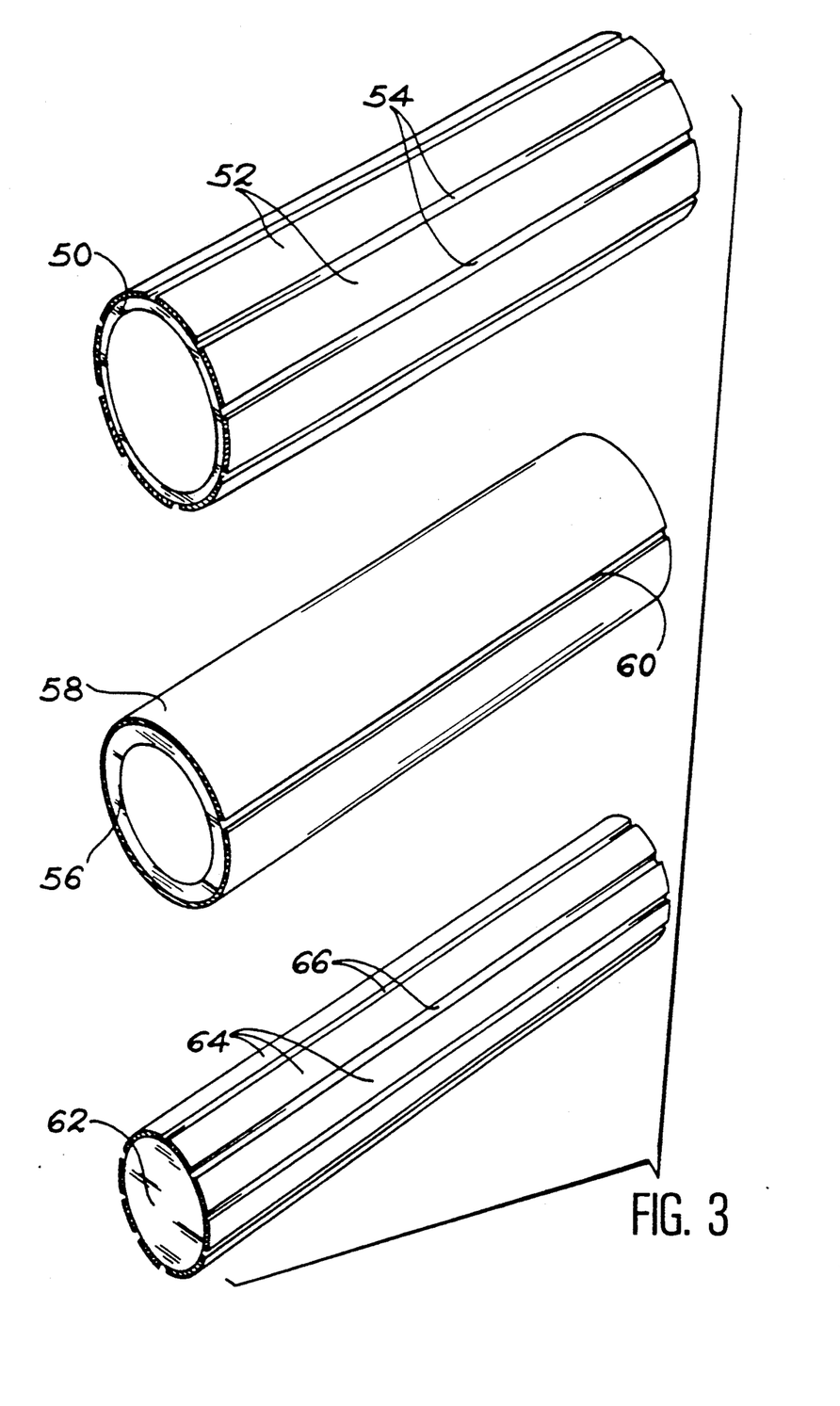
FIG. 3 shows according to a first embodiment three elements of a capacitor conforming to the invention.

FIGS. 3a-3c show three elements making it possible to embody a capacitor according to a first embodiment. These elements are constituted by:

a first nonconducting tube 50 externally coated with a first conductive film formed of strips 52 electrically separated from one another by intervals 54, a second nonconducting tube 56 coated with a second conductive film 58 cut by an interval 60, a central core 62 coated with a third conductive film formed of strips 64 separated by intervals 66.

The core 62 is nested in the tube 56 which is nested in the tube 50. Thus, a double capacitor is obtained with three armatures, the central armature being constituted by the conductor 58 on the tube 56.

In this embodiment, the nonconducting tubes may be made of quartz, pyrex, macor (registered trademarks), etc. These tubes are machined to one hundredth of a millimeter. They may also be embodied in porcelain by moulding.

The conductive films may be obtained by depositing silver paint directly spread onto the outer surface of the tubes and onto the central core and by annealing at 550° C. The thickness of the conductive film is about 2/100 mm.

It is also possible to obtain such tubes by depositing a conductive material on a flat insulant (made of mica, for example) by engraving this conductor so as to obtain strips and then by winding the unit so as to obtain a tube with the desired diameter. It is also possible to glue conductive strips onto a nonconducting tube.

Purely by way of explanation, it is possible to have a first tube 50 with an external diameter of 18 mm, an internal diameter of 16 mm and a length of 105 mm with 6 to 8 conductive strips spaced by one millimeter. The second tube 56 may have an outer diameter of 15.9 mm, an internal diameter of 13.9 mm and a length of 102 mm with a space of one millimeter interrupting the conductive film. Finally, the core 62 may have a diameter of 13.8 mm and a length of 102 mm. By sliding into the tube 56, this makes it possible to adjust the value of the total capacity.

When constituted in this way, the capacitor includes two sets of capacitors disposed in parallel:

a first unit constituted by the strips 52 of the first tube and the strip 58 of the second tube; in the example given above, each capacitor has a fixed capacity of 13 pF;

a second unit formed by the strips 64 of the core 62 and the film 58 of the second tube; in the example given earlier, the capacities vary between 0 (core completely withdrawn) and 3 pF (core completely driven in).

Figure 4:
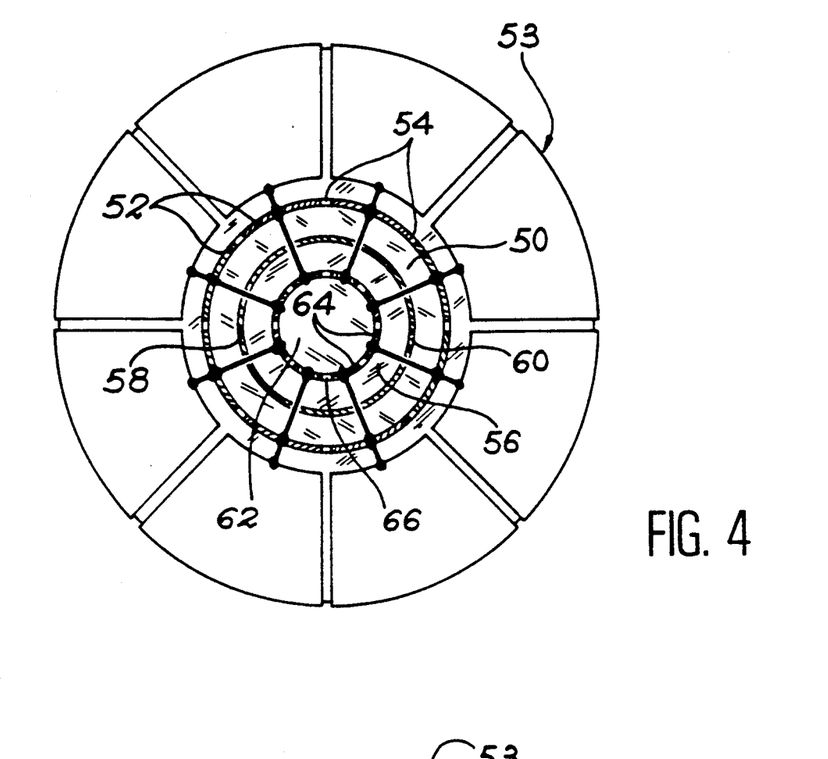
FIG. 4 shows the mode for connection with the external sectors of the resonator in this first embodiment.

The connections between these various strips and the sectors of the outer conductor are shown in FIG. 4. Each of the eight strips 52 is connected to one of the eight strips 64 and to one of the eight sectors 53 of the outer conductor. The conductor 58 of the central tube is not connected to the outer conductor but to the core of the coaxial feed cable (shown more clearly in FIG. 7).

Figure 5:
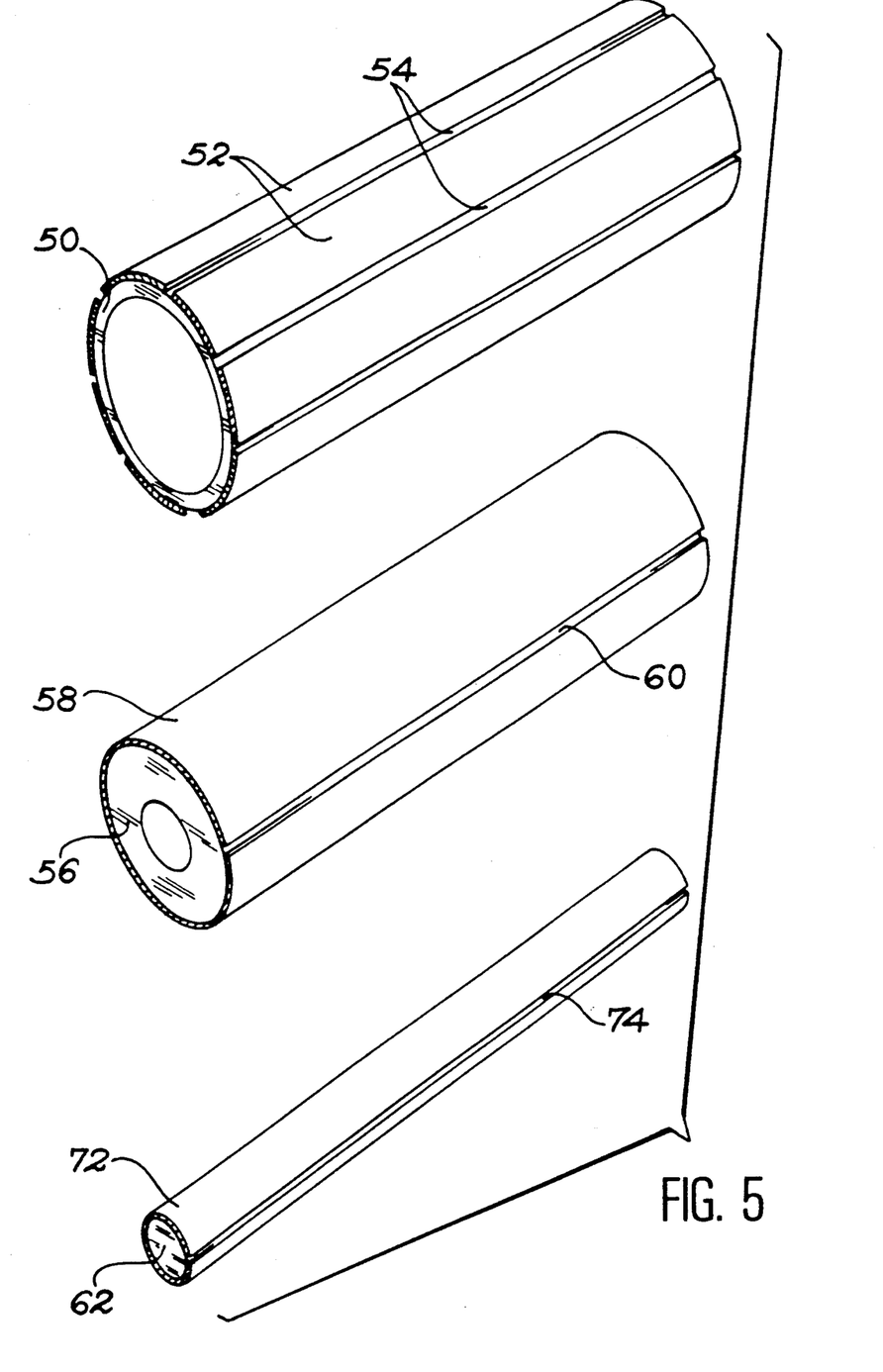
FIG. 5 shows, according to a second embodiment, three elements of a capacitor conforming to the invention.

Another embodiment of the capacitor is shown in FIGS. 5a-5c. This figure shows the first tube 50 of FIG. 3 and its conductive strips 52 with the slight difference that there are N−1 strips instead of N, N being an integer greater than 1, if N is the number of sectors 53 of the external conductor (thus, there will only be 7 strips instread of 8, for example). This figure also shows the core 62 with the slight difference of there being only one strip 72 (instead of 8) interrupted by an interval 74. Thus, there is no longer a single variable capacitor, namely the capacitor whose armatures include the films 58 and 72. The capacity then varies between 0 and 16 pF.

Figure 6:
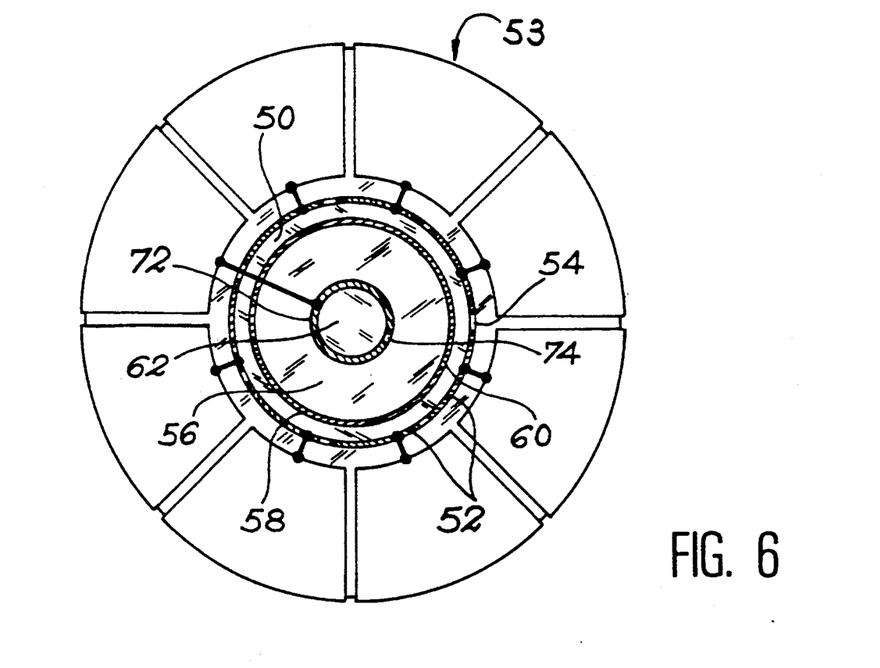
FIG. 6 shows the connections with the external sectors of the resonator in this embodiment.

The interconnection mode is then modified, as shown in FIG. 6. Seven of the sectors 53 are connected to the seven strips 52 of the outer tube and the eighth is connected to the single capacitor 72 of the core.

FIG. 7 shows a section of a coaxial resonator equipped with a capacitor distributed along the central conductor. This figure shows the elements already shown in FIG. 1, namely the flasks 22 (which here no longer have a hemispherical shape but a cylindrical shape), the outer conductor 20, the central conductor 10 and the coaxial feed cable 30. According to the invention, the central conductor 10 is constituted by one of the armatures nested into one another, namely 80, 82, 84 and preferably by 82. The armatures 80 and 84 are connected to the outer conductor 20, as shown in FIGS. 4 and 6, already described, and the central armature 82 is connected to the core of the feed cable 30, adaptation still being effected by a loop.

Adjustment of the overall capacity may be effected by adjusting driving in of the core, for example by rotation using a screwdriver 90 if a threading has been provided between the core and the armature 82 in which it is nested.

At this stage of the description of the invention, it ought to be mentioned that there currently exist adjustable cylindrical capacitors formed of two cylindrical armatures nested into each other. The document concerning the French patent FR-A-2 092 998 describes such a capacitor for RMN magnetometers. The present invention differs from the prior art, less by the actual structure of the capacitor than by virtue of its dispostion in the complete resonator. This point may be emphasized by FIG. 8 which shows the equivalent circuit diagram of a resonator conforming to the invention.

Section (a) of this figure shows the resonator 100 with one central conductor 10 and one outer conductor 20. This resonator is connected to an adaptation inductive resistor 42. In this respect, the diagram is the same as that of FIG. 2, section (a). But the difference with the prior art is that the capacitor is no longer adjustable at the end of the resonator, such as 44 shown on FIG. 2, but a capacitor distributed along the central conductor (armatures 101 and 102). Section (b) of FIG. 8 shows the equivalent circuit diagram of an elementary section of this resonator between the dimensions z and z+dz. As on the section (b) of FIG. 2, this figure shows the distributed inductive resistors L/2, the distributed resistors R/2, the distributed capacitor C with its parallel resistor R'; but the diagram of FIG. 8 offers this characteristic feature of having a distributed adjustable capacitor C'. In the device of the document FR-A-2 092 998, the cylindrical capacitor is placed at the end of the resonator, as shown in the diagram of section (a) of FIG. 2 (reference 44). This previous structure therefore shows all the drawbacks listed earlier, these drawbacks being able to be remedied by distributing the tuning capacitor of the present invention.

FIGS. 9 to 13 show other embodiments of the resonator of the invention.

Figure 9A:
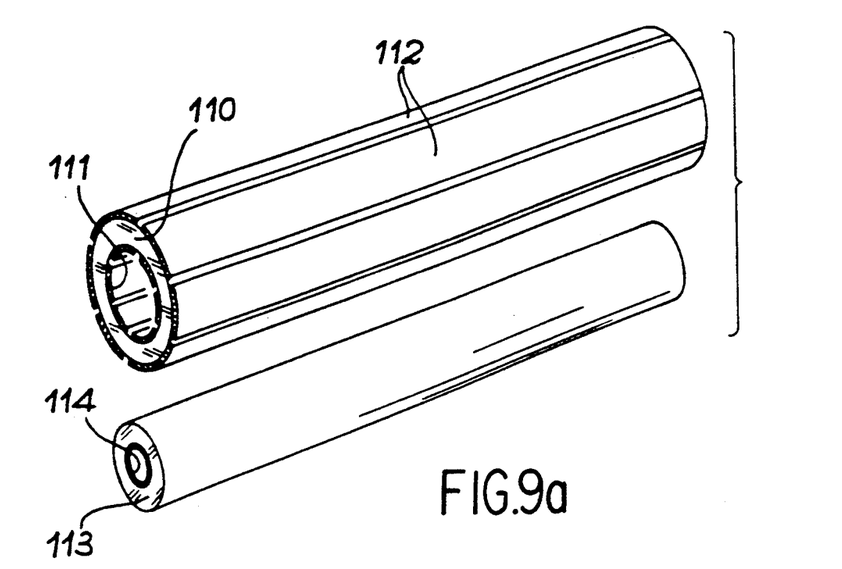
FIGS. 9a and 9b show a third embodiment with one single nonconducting tube.
Figure 9B:
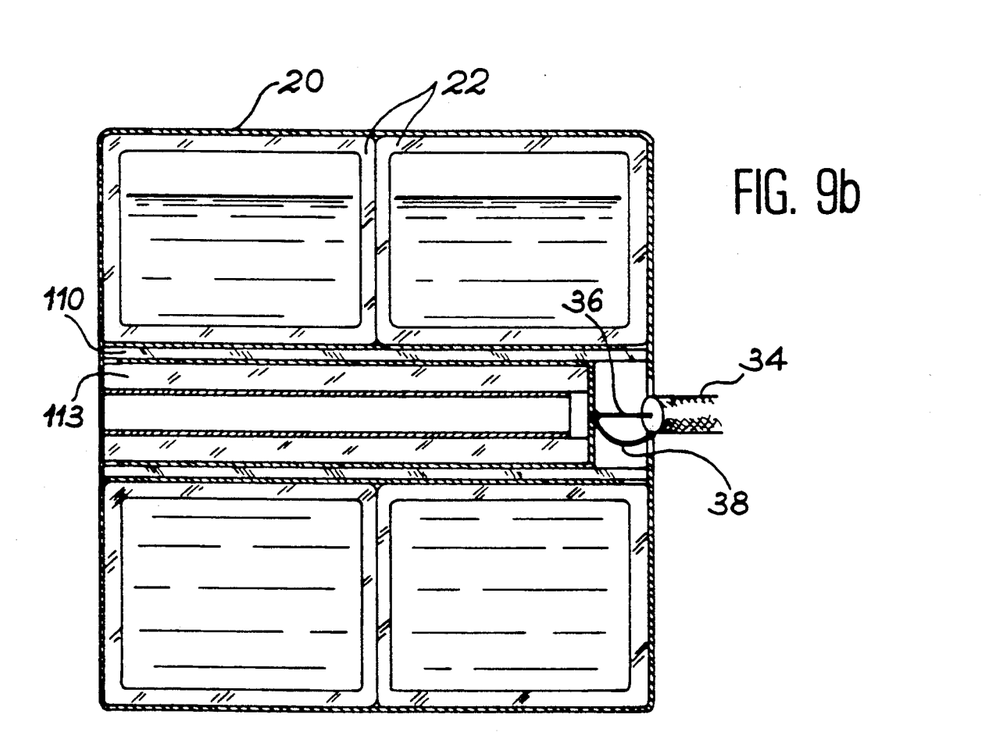

First of all, FIG. 9 shows (section a) a nonconducting tube 110 externally coated with a conductive film 112 and internally with a conductive film 111, both films being in the form of strips. Tuning is obtained by introducing a core 113 internally coated with a conductive film 114.

Figure 10A:
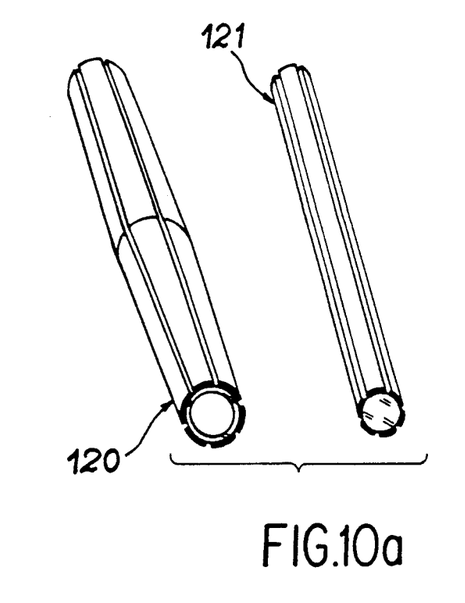
FIGS. 10a and 10b show one embodiment with excessive thickness.
Figure 10B:
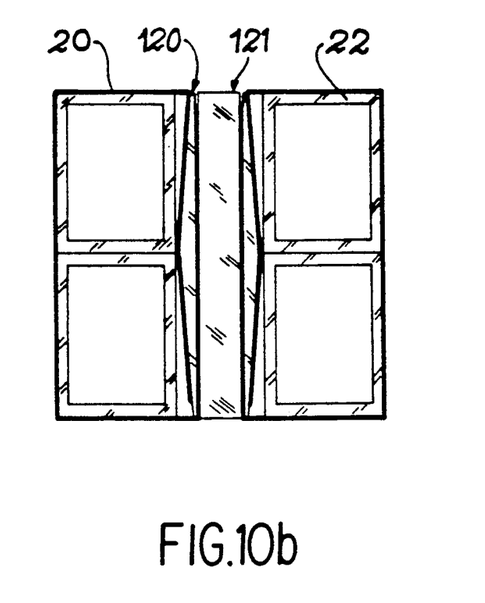
Figure 11A:
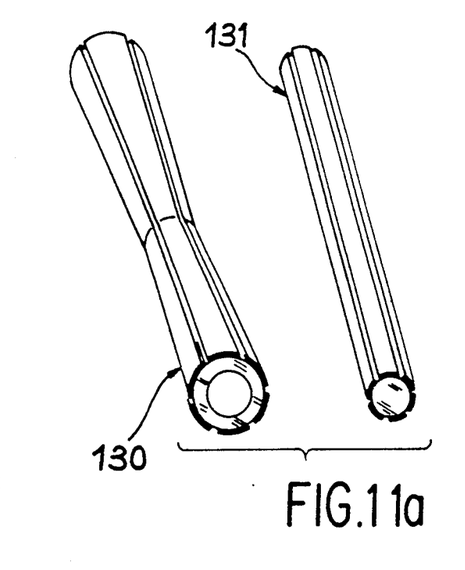
FIGS. 11a and 11b show another embodiment with excessive thickness.
Figure 11B:
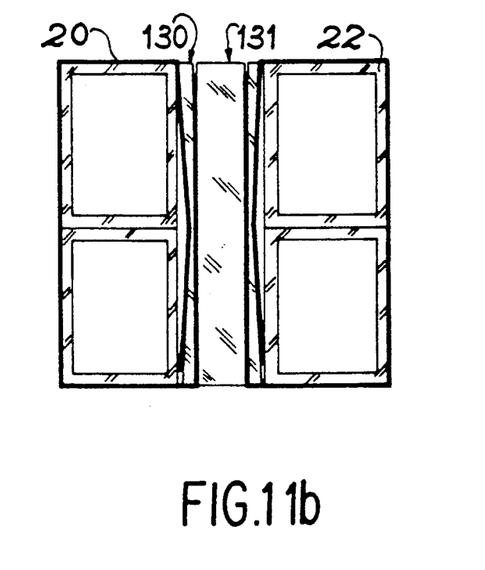

FIGS. 10 and 11 show the outer tube not having the same thickness over its entire length so that the distributed capacity varies along the axis of the resonator. FIG. 10, section a, shows the tube 120 being thicker at its middle than at its extremities, whereas in FIG. 11, section a, the tube 130 is thinner at its middle than at its extremities. In both these cases, an internal tube, respectively 121 and 131, is provided (constituting the central conductor, for example).

Figure 12A:
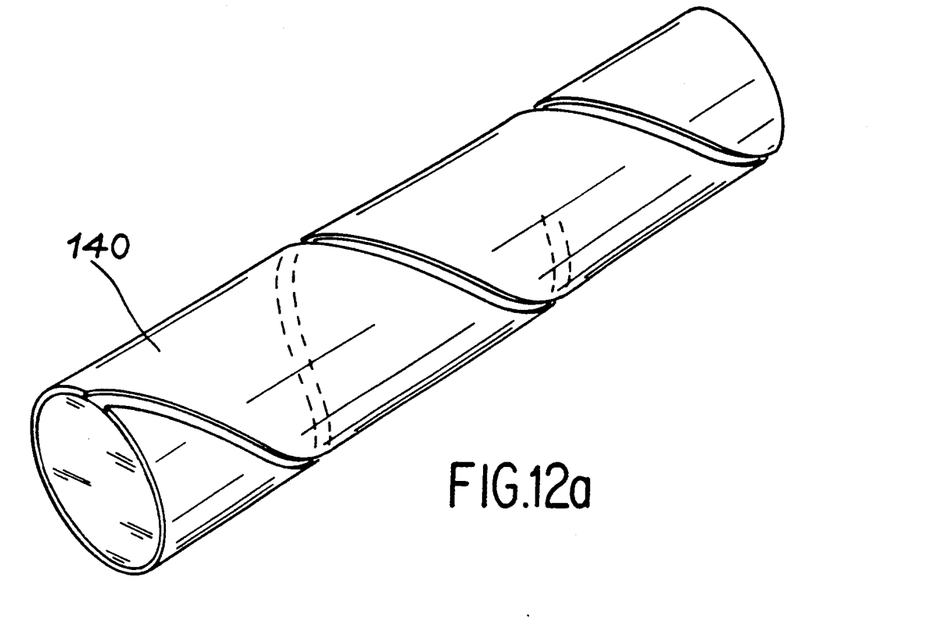
FIGS. 12a and 12b show one armature variant with spirally wound strips.
Figure 12B:
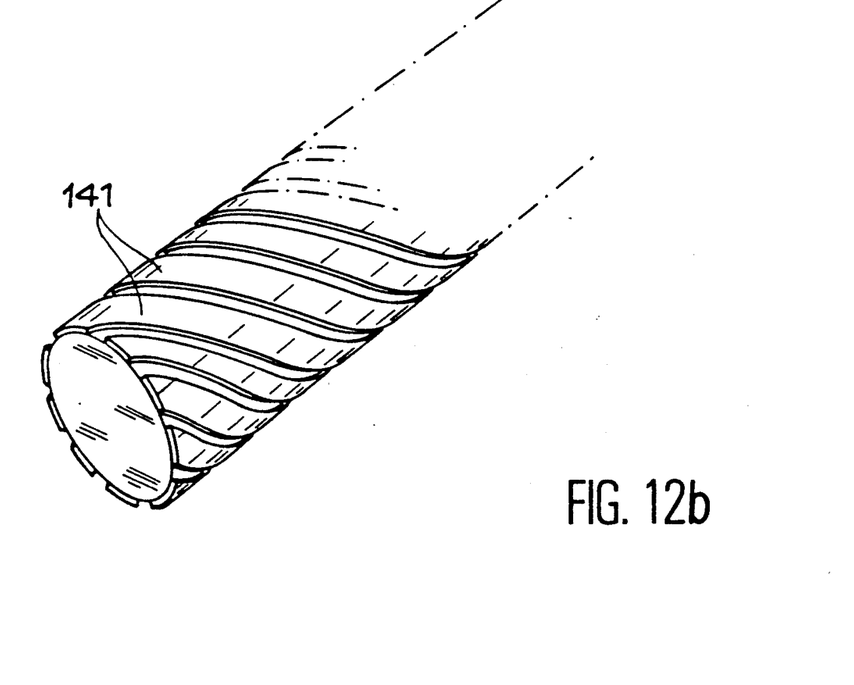

FIG. 12 shows two variants where the external conductive film has the shape of wide helical strips 140 (section a) or narrow strips 141 (section b).

Figure 13A:
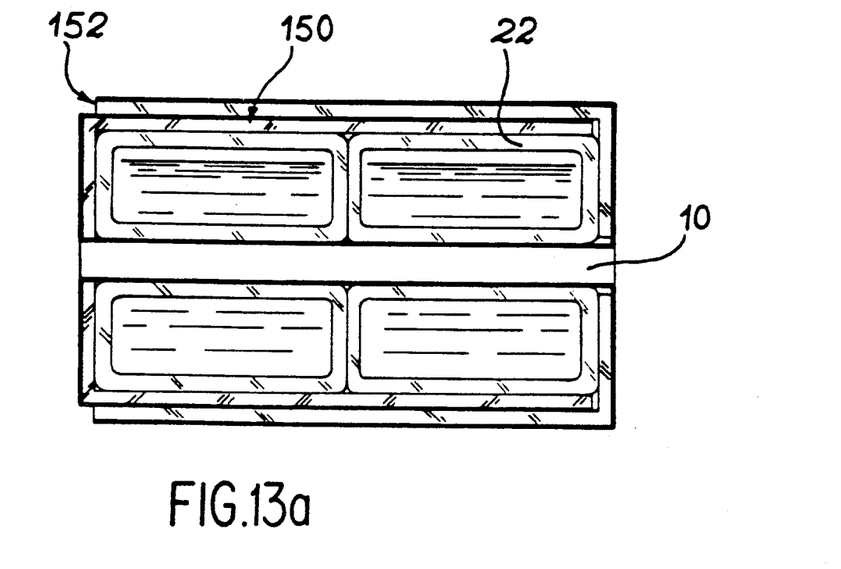
FIGS. 13a and 13b show one embodiment in which the capacitor is distributed at the periphery of the resonator.
Figure 13B:
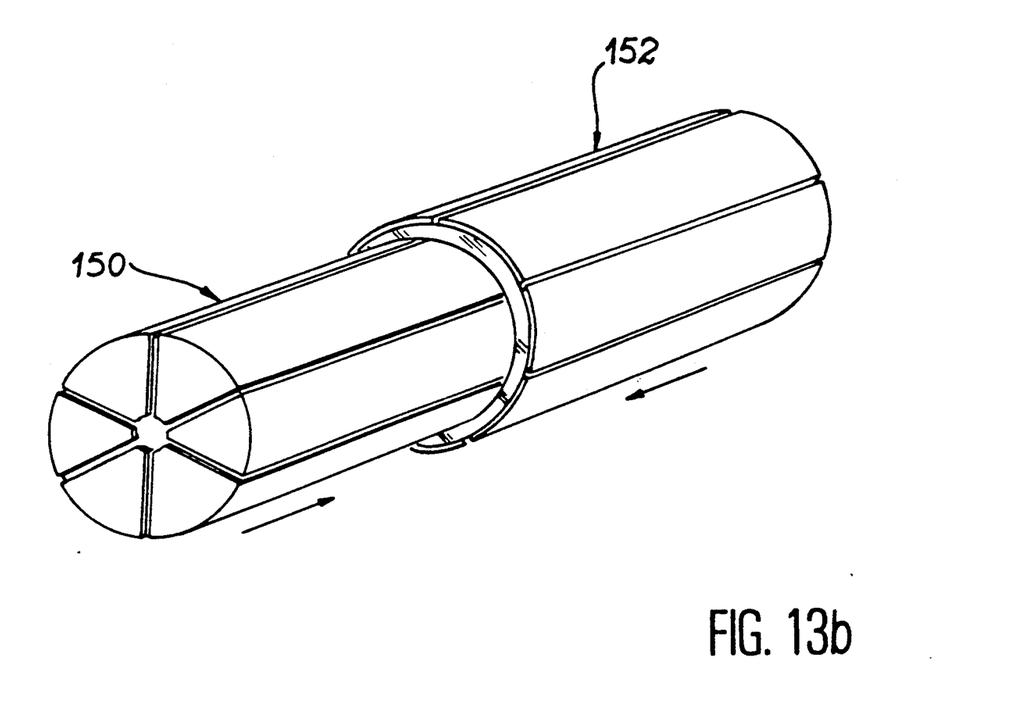

Finally, FIG. 13 shows an embodiment where the adjustment capacitor is disposed outside the resonator. This capacitor includes, for example, two tubes 150 and 152 nested into each other and coated with conductive strips (the central conductor 10 being constituted conventionally).

What is claimed is:

1. A coaxial resonator having a predetermined central axis, comprising:
    an outer conductor having a symmetry of revolution around said predetermined central axis;
    a tuning capacitor located inside said outer conductor and having a symmetry of revolution around said predetermined central axis, said tuning capacitor comprising:
        a first armature having a first non-conducting tube externally coated with a first conductive film;
        a second armature nested inside said first armature and having a second non-conducting tube externally coated with a second conductive film; and,
        a third armature nested inside said second armature and having a non-conducting core coated with a third conductive film.

2. The coaxial resonator according to claim 1, wherein the outer conductor is divided into a plurality of N conductive sectors electrically insulated from one another, N being an integer greater than 1, and the first conductive film of the first armature and the third conductive film of the third armature are also each formed of a plurality of N conductive strips electrically insulated from one another, each of the N sectors of the outer conductor being respectively electrically connected to one strip of the first armature and to one strip of the third armature.

3. The coaxial resonator according to claim 1, wherein the outer conductor is formed of N conductive sectors electrically insulated from one another, N being an integer greater than 1, and the first conductive film of the first armature is formed of N−1 conductive strips electrically insulated from one another, the N−1 strips being respectively connected to N−1 conductive sectors of the outer conductor, the Nth section of the outer conductor being connected to the third conductive film of the third armature of the capacitor.

4. The coaxial resonator according to claim 1, wherein at least, one of the first, second or third conductive films is in the form of helically-wound conductive strips.

5. A coaxial resonator having a predetermined central axis, comprising:
    an outer conductor having a symmetry of revolution around said predetermined central axis;

a tuning capacitor located inside said outer conductor and having a symmetry of revolution around said predetermined central axis, said tuning capacitor comprising:
- a first armature having a first non-conducting tube externally coated with a first conductive film; and,
- a second armature nested inside said first armature and having a second non-conducting tube externally coated with a second conductive film;

wherein the outer conductor is divided into a plurality of N conductive sectors electrically insulated from each other, N being an integer greater than 1, and the first conductive film of the first armature is also formed of a plurality of N conductive strips electrically insulated from one another, each of the N conductive sectors being electrically connected to one of the N conductive strips of the first conductive film.

6. The coaxial resonator according to claim 5, wherein at least one of the first or second conductive films is in the form of helically wound conductive strips.

7. The coaxial resonator according to claim 5, wherein one of the first or second armatures is movable with respect to the other, the tuning capacitor thereby having an adjustable capacity.

8. A coaxial resistor having a predetermined central axis, comprising:
an external conductor having a symmetry of revolution around said predetermined central axis;
a tuning capacitor located inside said external conductor and having a symmetry of revolution around said predetermined central axis, said tuning capacitor comprising:
- a first armature having a first non-conducting tube externally coated with a first conductive film, wherein the first non-conducting tube has a thickness which is different at its middle than at its two extremities; and,
- a second armature nested inside said first armature and having a second non-conducting tube externally coated with a second conductive film.

9. The coaxial resonator according to claim 8, wherein the first non-conducting tube is thinner at the middle than at the extremities.

10. The coaxial resonator according to claim 8, wherein the first non-conducting tube is thicker at the middle than at the extremities.

11. The coaxial resonator according to claim 8, wherein at least one of the first or second conductive films is in the form of helically-wound conductive strips.

* * * * *